United States Patent
Grant

(10) Patent No.: US 7,595,660 B2
(45) Date of Patent: Sep. 29, 2009

(54) LOW-DELAY COMPLIMENTARY METAL-OXIDE SEMICONDUCTOR (CMOS) TO EMITTER-COUPLED LOGIC (ECL) CONVERTERS, METHODS AND APPARATUS

(75) Inventor: David Alexander Grant, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/119,270

(22) Filed: May 12, 2008

(65) Prior Publication Data
US 2009/0045842 A1   Feb. 19, 2009

Related U.S. Application Data

(60) Provisional application No. 60/956,208, filed on Aug. 16, 2007.

(51) Int. Cl.
*H03K 19/0175* (2006.01)

(52) U.S. Cl. .......................................... 326/66; 326/73

(58) Field of Classification Search .................... 326/64, 326/66, 67, 69, 73–74, 77–78
See application file for complete search history.

(56) References Cited

U.S. PATENT DOCUMENTS

| | | | | |
|---|---|---|---|---|
| 4,656,375 A | * | 4/1987 | Lauffer et al. | 326/66 |
| 5,945,843 A | * | 8/1999 | Hirota et al. | 326/66 |
| 6,333,642 B1 | * | 12/2001 | Kurisu | 326/73 |

* cited by examiner

*Primary Examiner*—James Cho
(74) *Attorney, Agent, or Firm*—John J. Patti; Wade J. Brady, III; Frederick J. Telecky, Jr.

(57) ABSTRACT

Example low-delay complementary metal-oxide semiconductor (CMOS) to emitter-coupled logic (ECL) converters, methods and apparatus are disclosed. A disclosed example apparatus includes a reference level generator circuit to generate first and second reference signals and a bias signal based on a CMOS supply voltage, a source follower circuit to convert a CMOS input signal to a single-ended ECL signal based on the first and second reference signals, and an ECL buffer circuit to convert the single-ended ECL signal to a differential ECL output signal based on the bias signal and an ECL supply voltage.

20 Claims, 3 Drawing Sheets

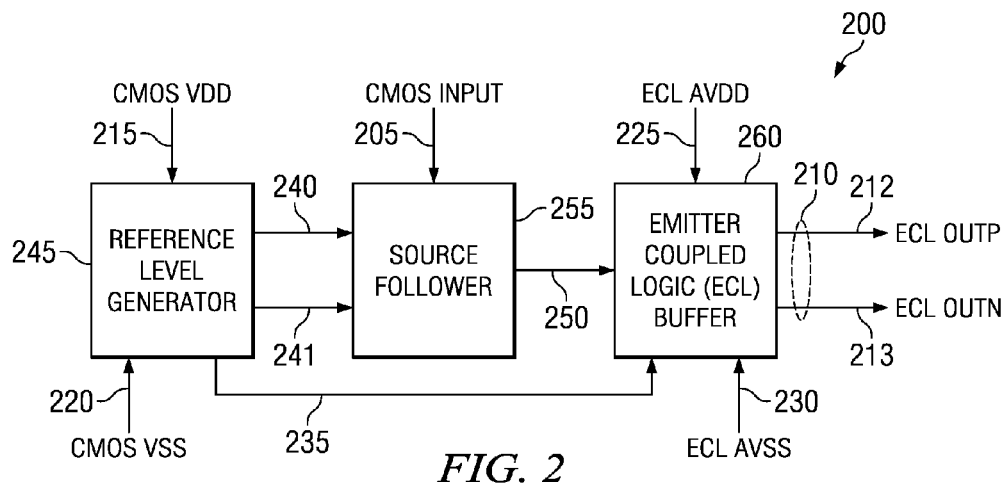
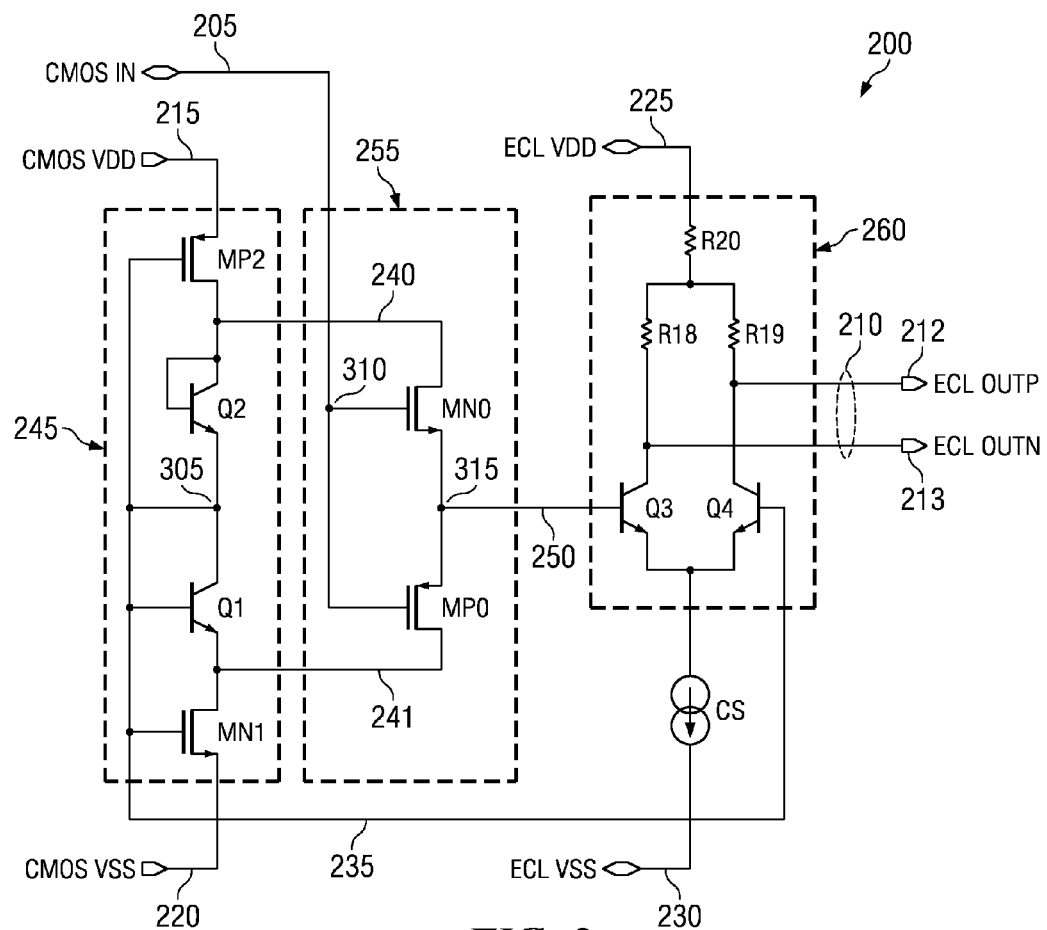
FIG. 2
FIG. 3

US 7,595,660 B2

LOW-DELAY COMPLIMENTARY METAL-OXIDE SEMICONDUCTOR (CMOS) TO EMITTER-COUPLED LOGIC (ECL) CONVERTERS, METHODS AND APPARATUS

RELATED APPLICATIONS

This application claims the benefit of U.S. Provisional Application No. 60/956,208, filed on Aug. 16, 2007, the entirety of which is incorporated by reference.

FIELD OF THE DISCLOSURE

This disclosure relates generally to signal converters, and, more particularly, to low-delay complementary metal-oxide semiconductor (CMOS) to emitter-coupled logic (ECL) converters, methods and apparatus.

BACKGROUND

In some applications and/or circuits (e.g., requiring high-speed logic) it is necessary and/or desirable to convert a rail-to-rail signal, such as that generated by complementary metal-oxide semiconductor (CMOS) logic, to a differential signal compatible with emitter-coupled logic (ECL) logic. An example ECL differential signal uses a −1.75 volt (V) signal with respect to ground on a positive signal component and a −0.9 V signal with respect to ground on a negative signal component to represent a logic value of "0"; and the −0.9 V signal on the positive signal component and the −1.75 V signal on the negative signal component to represent a logic value of "1."

BRIEF DESCRIPTION OF THE DRAWINGS

FIG. 2 is a schematic diagram of an example low-delay CMOS to ECL converter constructed in accordance with the teachings of the disclosure.

FIG. 3 is a schematic diagram of example manners of implementing the example reference level generator, the example source follower and/or the example ECL buffer of FIG. 2.

DETAILED DESCRIPTION

Example low-delay complementary metal-oxide semiconductor (CMOS) to emitter-coupled logic (ECL) converters, methods and apparatus are disclosed. A disclosed example apparatus includes a reference level generator circuit to generate first and second reference signals and a bias signal based on a CMOS supply voltage, a source follower circuit to convert a CMOS input signal to a single-ended ECL signal based on the first and second reference signals, and an ECL buffer circuit to convert the single-ended ECL signal to a differential ECL output signal based on the bias signal and an ECL supply voltage.

A disclosed example converter to convert a CMOS input signal to a differential ECL output signal includes a reference level generator circuit, a source follower and an ECL buffer. In one example, the reference level generator circuit includes first and second transistors connected in series between a first CMOS supply voltage and a second CMOS supply voltage. In such an arrangement, the gate input signals to the first and second transistors are used as a bias signal having a first value substantially mid-way between the first and second CMOS supply voltages. The example also includes first and second components connected in series between the first and second transistors. The bias signal is created at a first node where the first and second components are connected. The first component creates a first reference signal having a second value that is a first voltage above the bias signal and the second component creates a second reference signal having a third value that is a second voltage below the bias signal. In some examples, the source follower circuit includes third and fourth transistors connected in series between the first and second reference signals in a source follower topology to create a single-ended ECL signal at a second node where the third and fourth transistors are connected, the third and fourth transistors using as their gate input signals the CMOS input signal. The ECL buffer circuit thereby generates a differential ECL output signal based on the single-ended ECL signal and the bias signal.

A disclosed example method includes generating a bias signal and first and second reference signals based on a CMOS supply voltage, converting a CMOS input signal to a single-ended ECL signal based on the first and second reference signals, and buffering the single-ended ECL compatible signal to form a differential ECL signal based on the bias signal and an ECL supply voltage.

Figure 1:
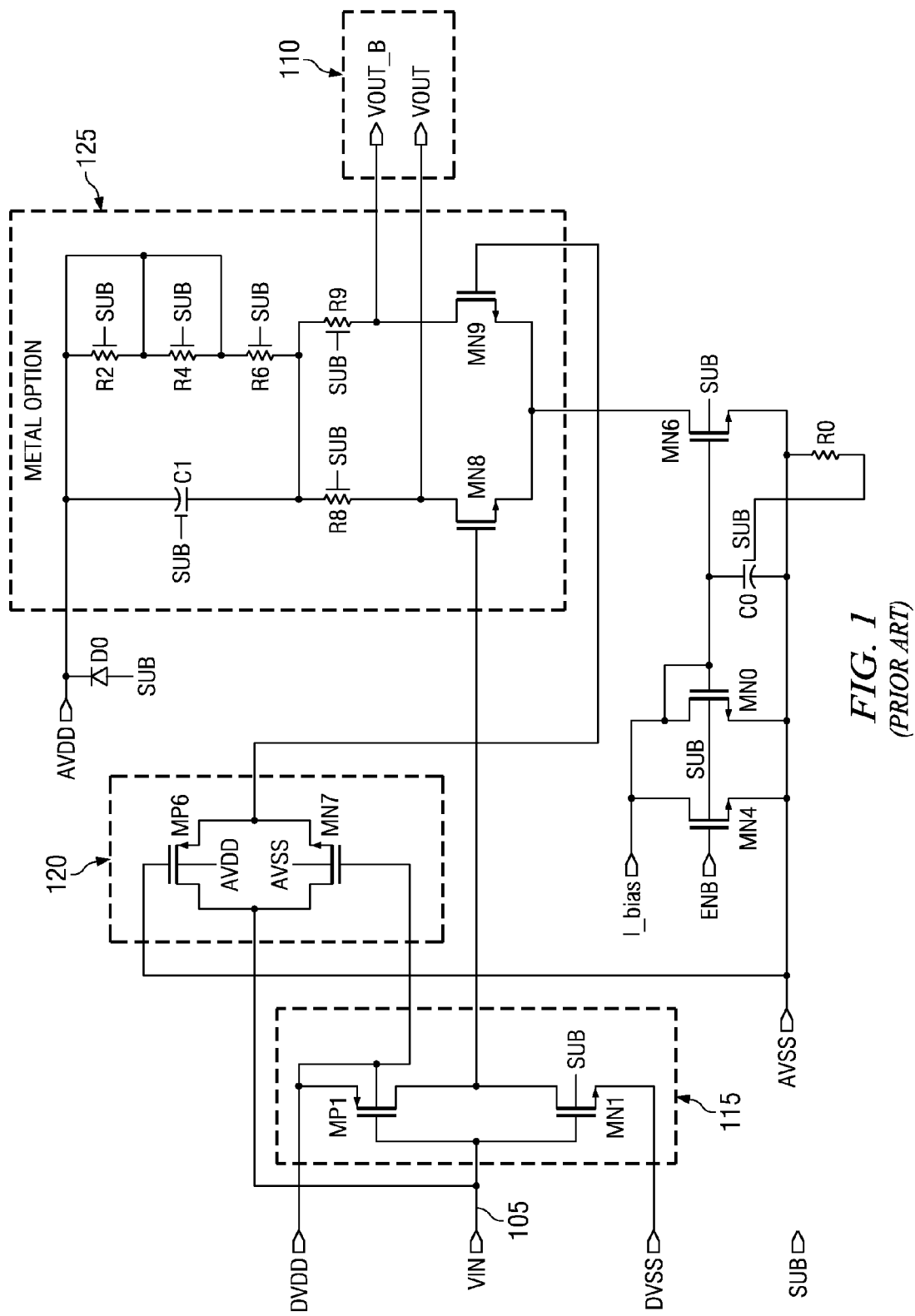
FIG. 1 is a schematic diagram of an example conventional complementary metal-oxide semiconductor (CMOS) to emitter-coupled logic (ECL) converter.

FIG. 1 is a schematic diagram of an example conventional CMOS to ECL converter 100. The example CMOS to ECL converter 100 of FIG. 1 converts a CMOS input signal 105 to a differential ECL output signal 110 via a CMOS inverter 115, and contains a delay stage 120 to equalize the delay in the two paths to a current mode logic (CML) buffer 125. The CML buffer 125 of FIG. 1 uses MOS input transistors since its inputs are CMOS levels and, thus, not compatible with a bipolar transistor based ECL buffer.

FIG. 2 is a schematic diagram of an example low-delay CMOS to ECL converter 200. The example CMOS to ECL converter 200 of FIG. 2 converts a CMOS input signal 205 to a differential ECL output signal 210. By eliminating the example CMOS inverter 115 and the example delay stage 120 of FIG. 1 and replacing the MOS based CML buffer 125 with a bipolar based ECL buffer 260, the example CMOS to ECL converter 200 of FIG. 2 substantially reduces the delay introduced by the conversion process. For instance, the example CMOS to ECL converter circuits disclosed herein only introduce an average delay of 40 pico seconds (ps) across temperature and semiconductor process variations, as compared to a typical delay of 400 ps introduced by the conventional CMOS to ECL converters (e.g., the example CMOS to ECL converter 100 of FIG. 1).

The example CMOS input signal 205 of FIG. 2 is a rail-to-rail signal taking on the value of a first CMOS supply voltage (CMOS VDD) 215 or a second CMOS supply voltage (CMOS VSS) 220 (e.g., a ground signal). The CMOS input signal 205 may also take on values falling between the CMOS supply voltage 215 and the CMOS ground signal 220 when transitioning between values, for example, as occurs on a rising and/or falling edge of the CMOS input signal 205. The example differential ECL output signal 210 of FIG. 2 comprises a positive signal component 212 and a negative signal component 213, the voltage differential thus between (e.g., the value of the positive signal component 212 minus the value of the negative signal component 213) represents digital logic bits.

To provide voltage supplies and/or references, the example CMOS to ECL converter 200 of FIG. 2 includes the example CMOS supply voltage 215, the example CMOS ground 220, a first ECL supply voltage (ECC VDD) 225 and a second ECL supply signal (ECC VSS) 230. An example set of supply voltages comprises a CMOS VDD 215 of 3 V, a CMOS VSS 220 of 0 V, an ECL VDD 225 of 3 V and an ECL VSS 230 of 0 V. As described below in connection with FIG. 3, the ECL supply voltages 225 and 230 of FIG. 2 also determine, at least partially, the signal levels that may occur on the positive and negative signal components 212 and 213. The example CMOS supply signals 215 and 220 and the example ECL supply signals 225 and 230 can be implemented by any number and/or type(s) of past, present and/or future voltage supply and/or ground signal source(s), device(s) and/or circuit (s).

To generate a bias signal 235 and a pair of reference signals 240 and 241, the example CMOS to ECL converter 200 of FIG. 2 includes a reference level generator 245. The example reference level generator 245 of FIG. 2 receives the CMOS supply signal 215 and the CMOS ground signal 220, and generates the bias signal 235 to be substantially mid-way between the CMOS supply signal 215 and the CMOS ground signal 220. The example reference level generator 245 generates the reference signal 240 such that its voltage is substantially a diode drop voltage (e.g., 0.7 volts (V)) above the bias signal 235, and the reference signal 241 such that its voltage is substantially a diode drop voltage below the bias signal 235. For example, for a CMOS supply voltage 215 of 3V, the bias signal 235 would have a voltage of approximately 1.5V, the reference signal 240 would have approximately a voltage of 2.2V, and the reference signal 241 would have a voltage of approximately 0.8V. An example manner of implementing the example reference level generator 245 of FIG. 2 is described below in connection with FIG. 3.

To convert the CMOS input signal 205 to a single-ended ECL signal 250, the example CMOS to ECL converter 200 of FIG. 2 includes a source follower 255. The example source follower 255 of FIG. 2 causes the single-ended ECL signal 250 to follow the CMOS input signal 205, but be bounded and/or limited by the example reference signals 240 and 241. That is the singled-ended ECL signal 250 represents an ECL compatible version of the CMOS input signal 250 with respect to the bias signal 235. For example, for a CMOS logical "1" and CMOS supply voltage 215 of 3V, the output 250 of the source follower 255 would be 2.2 V. Conversely, the voltage of the output 250 for a logical "0" would be 0.9 V. An example manner of implementing the example source follower 255 of FIG. 2 is described below in connection with FIG. 3.

To buffer the single-ended ECL signal 250, the example CMOS to ECL converter 200 of FIG. 2 includes an ECL buffer 260. The example ECL buffer 260 of FIG. 2 transforms the single-ended ECL signal 250 into the differential ECL output signal 210 based on the bias signal 235 and the ECL supply voltage 225. The example differential ECL output signal 210 of FIG. 2 follows the single-ended ECL signal 250, but the desired range for the values of the positive and negative signals 212 and 213 are determined by the ECL buffer 260 based on the ECL supply voltage 225 and a set of resistors (e.g., the example resistors R18, R19 and R20 of FIG. 3). An example manner of implementing the example ECL buffer 260 of FIG. 2 is described below in connection with FIG. 3.

FIG. 3 illustrates an example manner of implementing the example reference level generator 245, the example source follower 255, the example ECL buffer 260 and/or, more generally, the example CMOS to ECL converter 200 of FIG. 2. To generate the example bias signal 235, which is substantially mid-way between the CMOS supply 215 and the CMOS ground 220, the example reference level generator 245 of FIG. 3 includes junction field-effect transistors (JFETs) MN1 and MP2. The CMOS supply 215 is connected to the drain of MP2. To generate the reference signals 240 and 241, the example reference level generator 245 of FIG. 3 includes bipolar junction transistors (BJTs) Q1 and Q2. The example transistors MP2, Q2, Q1 and MN1 are connected in series in a voltage divider topology to generate the bias signal 235, as illustrated in FIG. 3. The example bias signal 235 of FIG. 3 is generated at the point 305 where the collector of example transistor Q1 is electrically coupled to the emitter of example transistor Q2, and this node 305 is connected to the gate input of both of the transistors MP2 and MN1. The example transistors Q1 and Q2 of FIG. 3 have their bases coupled to their collectors and, thus, are each configured in a diode topology. Accordingly, the example reference signal 240 is substantially a diode drop voltage (e.g., 0.7V) above the bias signal 235, and the example reference signal 241 is substantially a diode drop voltage below the bias signal 235. Any number and/or type(s) of components could be used instead of, or in addition to, the example transistors Q1 and Q2 to create the example diode drop voltages of FIG. 3. For example, either or both of the transistors Q1 and Q2 could be replaced by diodes. The example bias signal 235 is substantially at the midpoint of the CMOS supplies 215 and 220. However, the bias signal 235 may alternatively be adjusted to be somewhat higher or lower as benefits the operation of the example converter 200 in a particular application, to account for process variability, temperature variation and/or absolute supply voltage levels.

To form the single-ended ECL signal 250, the example source follower 255 of FIG. 3 includes MOS field-effect transistors (MOSFETs) MN0 and MP0. The example transistors MN0 and MP0 of FIG. 3 are connected in series between the reference signals 240 and 241 in a source follower topology. The gates of transistors MN0 and MP0 are coupled together at a node 310 to form an input for the CMOS input signal 205. The example single-ended ECL signal 250 of FIG. 3 is generated at a node 315 where the source of example transistor MN0 is electrically coupled to the source of example transistor MP0. When the CMOS input signal 205 has a logical high value (e.g., 3V), the example transistor MN0 of FIG. 3 is turned on and the example transistor MP0 of FIG. 3 is turned off such that the single-ended ECL signal 250 takes on the value of the reference signal 240 (e.g., 2.2V). Likewise, when the CMOS input signal 205 has a logical low value (e.g., 0V), the transistor MN0 is turned off and the transistor MP0 is turned on such that the single-ended ECL signal 250 takes on the value of the reference signal 241 (e.g., 0.8V). In this fashion, the example source follower 255 of FIG. 3 forms a single-ended ECL signal 250 that follows the CMOS input signal 205, is centered around the bias signal 235, and is bounded and/or limited by the reference signals 240 and 241.

To buffer the single-ended ECL signal 250, the example ECL buffer 260 of FIG. 2 includes BJT transistors Q3 and Q4, and resistors R18, R19 and R20. The example transistors Q3 and Q4 of FIG. 3 are connected in a differential switch topology such that one, but not both, of the example transistors Q3 and Q4 is turned on at a given time. For example, when the single-ended ECL signal 250 is sufficiently greater than the bias signal 235 (e.g., by 200 millivolts (mV)), the transistor Q3 is turned on and the transistor Q4 is turned off.

The example resistors R18, R19 and R20 of FIG. 3 determine the allowable range of voltages for the positive and negative ECL signals 212 and 213. The example resistors R18, R19 and R20 are arranged in a voltage divider topology. In the illustrated example of FIG. 3, the resistance of the resistor R20 is selected to determine the largest voltage that the signals 212 and 213 can have. The example resistors R18 and R19 of FIG. 3 are selected to have the same resistance, and the resistance is selected to determine the difference between the largest voltage and the smallest voltage that the signals 212 and 213 can have. For example, when the example transistor Q3 of FIG. 3 is turned on, current flows through the left branch of the ECL buffer 260 and the voltage drop across the resistor R20 determines the voltage of the positive signal 212 and the voltage drop across the series combination of resistors R20 and R18 determines the voltage of the negative signal 213. Likewise, when the example transistor Q4 is turned on, current flows through the right branch of the ECL buffer 260 and the voltage drop across the resistor R20 determines the voltage of the negative signal 213 and the voltage drop across the series combination of resistors R20 and R19 determines the voltage of the positive signal 212.

To control the amount of current that flows through the ECL buffer 260, the example circuit of FIG. 3 includes any type of current source CS. The example current source CS and the resistors R18, R19 and R20 determine the voltage values taken by the positive and negative signals 212 and 213. For example, if the current source CS provides 200 micro Amps (uA) of current, the resistance of R20 is 2.5 thousand ohms (kΩ), and the resistances of R18 and R19 are 2.7 kΩ, then the largest voltage for the positive and negative signals 212 and 213 is 250 mV below the ECL supply voltage 225, and the smallest voltage for the signals 212 and 213 is 520 mV below the ECL supply voltage 225.

Figure 4:
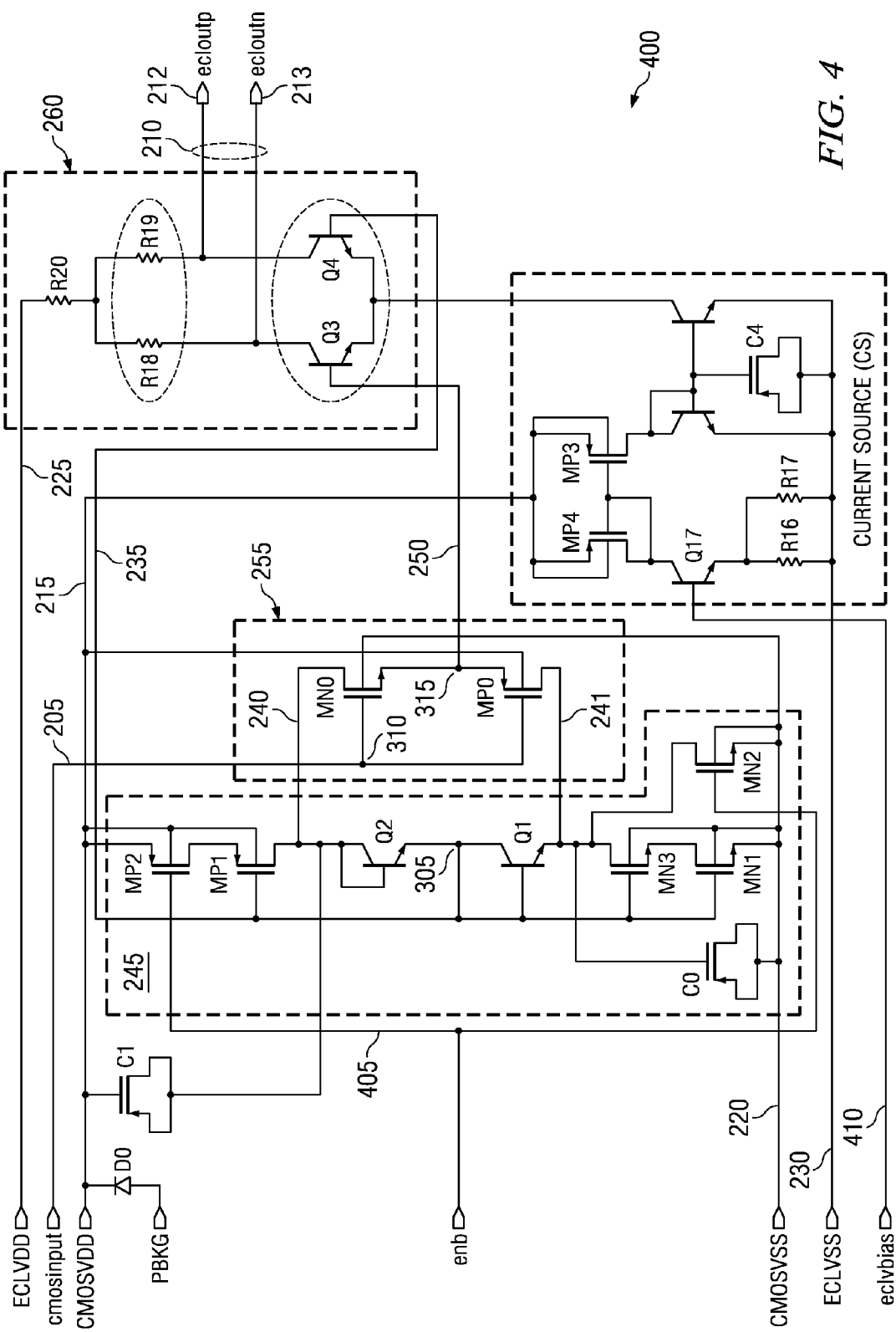
FIG. 4 is a diagram of an example circuit implementing the example CMOS to ECL converter of FIG. 3.

FIG. 4 is a schematic illustration of an example circuit 400 that implements and/or includes the example reference signal generator 245, the example source follower 255, the example ECL buffer 260 and/or, more generally, the example CMOS to ECL converter 200 of FIGS. 2 and/or 3. Portions of the example circuit 400 of FIG. 4 are identical to those discussed above in connection with FIG. 3 and, thus, the descriptions of those portions are not repeated here. Instead, identical elements are illustrated with identical reference numerals in FIGS. 3 and 4, and the interested reader is referred back to the descriptions presented above in connection with FIG. 3 for a complete description of those like-numbered elements.

To enable and/or disable the example circuit 400 of FIG. 4, the example circuit 400 includes an enable input signal 405 and transistors MP1, MN2 and MN3. When the example enable input signal 405 is a logical "1", the transistors MP1, MN2 and MN3 are in an "on" state that enables the transistors MP2, MN1, Q1 and Q2 to behave as described above in connection with FIG. 3. However, when the enable signal 405 is a logical "0", the transistors MP2, MN1, Q1 and Q2 are biased into an "off" state and, thus, the operation of the example circuit 400 is effectively disabled.

To control a bias of the example ECL buffer 260, the example circuit 400 of FIG. 4 includes a bias input signal 410. The example bias input signal 410 of FIG. 4 controls the amount of current generated by the example current source CS, and the voltage drops that occur across the resistors R18, R19 and R20. Thus, the voltage values taken by the positive and negative signal components 212 and 213 may be adjusted by controlling the value of the bias input signal 410. For example, a bias input signal 410 equal to the Vbe of Q17 plus 100 mV, yields voltage values of (ECLVDD—0.25 V) and (ECLVDD—0.52 V) for the signal components 212 and 213. A bias input signal equal to the Vbe of Q17 plus 50 mV, yields voltage values of (ECLVDD—0.125 V) and (ECLVDD—0.26 V) for the signal components 212 and 213.

The example current source CS of FIG. 4 is configured in a simple bipolar current mirror topology and operates as follows. A bias voltage is present on the base of Q17, such that, for example, the current into the collector of Q17 is 100 uA. This current passes through the diode connected p-channel MOSFET (PMOS) MP4 forming a simple MOS current mirror with MP3. The current out of the drain of MP3 has the same magnitude as that in the drain of MP4. The current from the drain of MP3 is fed into a diode connected NPN transistor, which forms a simple current mirror with another NPN, which provides the current of 100 uA into the ECL buffer 260. Alternatively, the current of 100 uA into the ECL buffer 260 may be generated in any other way, depending on the specific needs of the application. For example, the current could be provided by a resistor connected to ECLVSS.

While example manners of implementing a low-delay CMOS to ECL converter are illustrated in FIGS. 2, 3 and 4, a reference signal generator, a source follower and/or an ECL buffer may be implemented using any number and/or type(s) of alternative and/or additional logic, devices, components, circuits, modules, interfaces, etc. Further, the logic, devices, components, circuits, modules, elements, interfaces, etc. illustrated in FIGS. 2, 3 and/or 4 may be combined, divided, re-arranged, omitted, eliminated and/or implemented in any other way. For example reference signal generator 245, the example source follower 255, the example ECL buffer 260 may be implemented together within a single integrated circuit (IC) and/or with multiple ICs. Moreover, a CMOS to ECL converter may include additional logic, devices, components, circuits, interfaces and/or modules instead of, or in addition to those illustrated in FIGS. 2, 3 and/or 4.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A converter to convert a complementary metal-oxide semiconductor (CMOS) input signal to a differential emitter-coupled logic (ECL) output signal, the converter comprising:

a reference level generator circuit comprising:

first and second transistors connected in series between a first CMOS supply voltage and a second CMOS supply voltage, and using as their gate input signals a bias signal, the bias signal to have a first value substantially mid-way between the first and second CMOS supply voltages; and first and second components connected in series between the first and second transistors, the bias signal to be created at a first node where the first and second components are connected, the first component to create a first reference signal to have a second value a first voltage above the bias signal, the second component to create a second reference signal to have third value a second voltage below the bias signal;

a source follower circuit comprising third and fourth transistors connected in series between the first and second reference signals in a source follower topology to create a single-ended ECL signal, the single-ended ECL signal to be created at a second node where the third and fourth transistors are connected, the third and fourth transistors using as their gate input signals the CMOS input signal; and an ECL buffer circuit to generate the differential ECL output signal based on the single-ended ECL signal and the bias signal.

2. A CMOS to ECL converter as defined in claim 1, wherein the second CMOS supply voltage comprises a ground voltage.

3. A CMOS to ECL converter as defined in claim 1, wherein the first voltage and the second voltage each comprise a diode drop voltage from the bias voltage.

4. A CMOS to ECL converter as defined in claim 1, wherein the ECL buffer comprises:
- a fifth transistor having the single-ended ECL signal as its gate input signal;
- an sixth transistor having the bias signal as its gate input signal, the fifth and sixth transistor configured in a differential switch topology;
- a first resistor connected to an ECL supply voltage to set a first voltage limit for a positive ECL output signal component of the ECL output signal; and
- a second resistor connected between the first resistor and the seventh transistor to set a second voltage limit for the positive ECL output signal.

5. A CMOS to ECL converter as defined in claim 1, wherein the first component comprises a fifth transistor configured in a diode topology.

6. An apparatus comprising:
- a reference level generator circuit to generate first and second reference signals and a bias signal based on a complementary metal-oxide semiconductor (CMOS) supply voltage;
- a source follower circuit to convert a CMOS input signal to a single-ended emitter-coupled logic (ECL) signal based on the first and second reference signals; and
- an ECL buffer circuit to convert the single-ended ECL signal to a differential ECL output signal based on the bias signal and an ECL supply voltage.

7. An apparatus as defined in claim 6, wherein the first reference signal is to have a first value a first voltage above the bias signal, the second reference signal is to have a second value the first voltage above the bias signal, and the bias signal is to have a third value substantially mid-way between the CMOS voltage signal and a CMOS ground signal.

8. An apparatus as defined in claim 7, wherein the first voltage comprises a diode drop voltage.

9. An apparatus as defined in claim 6, wherein the reference level generator circuit comprises:
- first and second transistors to generate a bias signal substantially mid-way between the CMOS supply voltage and a second CMOS supply voltage; and
- a first component to generate the first reference signal based on the third reference signal; and
- a second component to generate the second reference signal based on the third reference signal.

10. An apparatus as defined in claim 9, wherein the second CMOS supply voltage comprises a ground voltage.

11. An apparatus as defined in claim 9, wherein the first component comprises a diode, and the first reference signal is to have a value a diode drop voltage above the bias signal.

12. An apparatus as defined in claim 9, wherein the first component comprises a third transistor configured in a diode arrangement, and the first reference signal is to have a value a diode drop voltage above the bias signal.

13. An apparatus as defined in claim 6, wherein the single-ended ECL signal is to follow the CMOS input signal and be limited by the first and second reference signals.

14. An apparatus as defined in claim 6, wherein the source follower circuit comprises:
- a first transistor having the first reference signal as its power rail and the CMOS input signal as its gate input signal; and
- a second transistor having the second reference signal as its power rail and the CMOS input signal as its gate input signal, wherein outputs of the first and second transistors are electrically coupled to generate the singled-ended ECL signal.

15. An apparatus as defined in claim 6, wherein the source follower circuit comprises first and second transistors configured in a source follower topology.

16. An apparatus as defined in claim 6, wherein the ECL buffer circuit comprises:
- a first transistor having the singled-ended ECL signal as its gate input signal; and
- a second transistor having the bias signal as its gate signal, wherein the first reference signal is to have a first value a first voltage above the bias signal, the second reference signal is to have a second value the first voltage above the bias signal, and the bias signal is to have a third value substantially mid-way between the CMOS voltage signal and a CMOS ground signal.

17. An apparatus as defined in claim 16, wherein the ECL buffer circuit further comprises:
- a first resistor connected to the ECL supply voltage to determine a first voltage limit for a positive ECL output; and
- a second resistor connected between the first resistor and the first transistor to determine a second voltage limit for the positive ECL output.

18. A method comprising:
- generating a bias signal and first and second reference signals based on a complementary metal-oxide semiconductor (CMOS) supply voltage;
- converting a CMOS input signal to a single-ended emitter-coupled logic (ECL) signal based on the first and second reference signals; and
- buffering the single-ended ECL compatible signal to form a differential ECL signal based on the bias signal and an ECL supply voltage.

19. A method as defined in claim 18, wherein the first reference signal is to have a first value a first voltage above a bias signal, the second reference signal is to have a second value the first voltage above the bias signal, and the bias signal is to have a value substantially mid-way between the CMOS voltage signal and a second CMOS voltage supply.

20. A method as defined in claim 18, wherein the single-ended ECL signal is to follow the CMOS input signal and be limited by the first and second reference signals.

* * * * *